(12) United States Patent
Kuriyama

(10) Patent No.: US 7,023,034 B2
(45) Date of Patent: Apr. 4, 2006

(54) SOLID-STATE IMAGING DEVICE WITH IMPROVED IMAGE SENSITIVITY

(75) Inventor: Toshihiro Kuriyama, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/891,103

(22) Filed: Jul. 15, 2004

(65) Prior Publication Data

US 2005/0045928 A1    Mar. 3, 2005

(30) Foreign Application Priority Data

Aug. 29, 2003 (JP) .............................. 2003-307696

(51) Int. Cl.
*H01L 31/062* (2006.01)

(52) U.S. Cl. ....................... 257/291; 257/290; 257/233; 257/258; 438/48; 438/70

(58) Field of Classification Search ...................... None
See application file for complete search history.

(56) References Cited

U.S. PATENT DOCUMENTS 4,708,436 A * 11/1987 Kleinknecht ................. 359/575
6,246,081 B1    6/2001 Abe

FOREIGN PATENT DOCUMENTS

| JP | 10-229180 | 8/1998 |
|---|---|---|
| JP | 11-087674 A | 3/1999 |
| JP | 2001-77339 A | 3/2001 |

* cited by examiner

*Primary Examiner*—Nathan J. Flynn
*Assistant Examiner*—Scott R. Wilson
(74) *Attorney, Agent, or Firm*—McDermott Will & Emery LLP

(57) ABSTRACT

The solid-state imaging device according to the present invention comprises: a plurality of light-sensitive elements 1 arranged in a matrix form at regular spacings in a photoreceiving region provided on a semiconductor substrate; a plurality of detecting electrodes provided on the semiconductor substrate corresponding to the plurality of the light-sensitive elements for detecting an electrical charge generated by each light-sensitive element; a light-shielding film 58 coating the plurality of detecting electrodes and having an aperture 65 over each light-sensitive element; and a plurality of reflecting walls 62, which are formed in a grid pattern over the light-shielding film so as to partition the apertures individually over the respective light-sensitive elements, for reflecting a portion of light entering the semiconductor substrate from above onto the aperture on each light-sensitive element. The plurality of reflecting walls are formed so that a middle point of the reflecting walls opposing each other across the aperture is displaced from a center of the aperture toward a center of the photoreceiving region.

18 Claims, 11 Drawing Sheets

SOLID-STATE IMAGING DEVICE WITH IMPROVED IMAGE SENSITIVITY

BACKGROUND OF THE INVENTION

1. Field of the Invention

The present invention relates to a solid-state imaging device. More particularly, the present invention relates to a solid-state imaging device in which a plurality of light-sensitive elements are arranged in a matrix form.

2. Description of the Background Art

In order to improve the light collecting power of a solid-state imaging device typified by a CCD, there exists a solid-state imaging device in which two micro lenses are formed as shown in FIG. 8. Hereinafter, with reference to FIG. 8, the above-described solid-state imaging device will be described.

The solid-state imaging device as shown in FIG. 8 includes a semiconductor substrate 501, a gate insulating film 502, a gate electrode 503, a photodiode 504, a charge transfer section 505, an interlayer insulating film 507, a light-shielding film 508, an insulating film 509, an intralayer lens 510, a planarization film 511, a color filter 513, and an on-chip micro lens 514.

The photodiode 504 and the charge transfer section 505 are formed on the semiconductor substrate 501. A surface of the semiconductor substrate 501 is coated with the gate insulating film 502, and the gate electrode 503 is formed on the gate insulating film 502. The interlayer insulating film 507 is formed on the gate electrode 503. Further, the light-shielding film 508 is formed so as to coat the gate insulating film 502 and the interlayer insulating film 507.

Also, the insulting film 509 is formed on the light-shielding film 508. The intralayer lens 510 and the planarization film 511 are formed on the insulating film 509. Further, the color filter 513 is formed on the planarization film 511. The on-chip micro lens 514 is formed on the color filter 513 for each photodiode 504.

As described above, in the solid-state imaging device as shown in FIG. 8, the on-chip micro lens 514 is formed on the top layer of the solid-state imaging device, and the intralayer lens 510 is formed in the planarization film 511. As such, two micro lenses are formed for each photodiode 504, whereby it is possible to further efficiently collect light onto the photodiode 504.

However, the solid-state imaging device as shown in FIG. 8 has a problem that light entering the solid-state imaging device obliquely from above (hereinafter, referred to as oblique light) enters an adjacent pixel, whereby color mixing occurs.

Thus, a solid-state imaging device as shown in FIG. 9 has been developed as a solid-state imaging device capable of preventing color mixing caused by the oblique light. FIG. 9 is a cross section view of the above-described solid-state imaging device.

The solid-state imaging device as shown in FIG. 9 differs from the solid-state imaging device as shown in FIG. 8 in that reflecting walls 512a and 512b are additionally provided on both sides of the intralayer lens 510. As such, the reflecting walls 512a and 512b are additionally provided, whereby the oblique light is reflected by the reflecting walls 512a and 512b, as shown in FIG. 9. As a result, the oblique light enters the photodiode 504. Thus, it is possible to solve the problem of color mixing of the solid-state imaging device. Further, the oblique light, which is not originally collected, enters the photodiode 504, thereby improving the light sensitivity of each pixel of the solid-state imaging device (see Japanese Laid-Open Patent Publication No. 2001-77339).

In the solid-state imaging device shown in FIG. 9, the light sensitivity of the solid-state imaging device is improved as a whole. However, there is still variation in the light sensitivity among the pixels of the solid-state imaging device. Hereinafter, with reference to the drawing, such variation in the light sensitivity will be described in detail. FIG. 10 is a graph showing a distribution of light sensitivity of a camera device with an optical lens, into which a solid-state imaging device is built. Note that a vertical axis represents light sensitivity, and a horizontal axis represents a position of a pixel in the solid-state imaging device.

First, there is a certain relationship between a position of a pixel in the solid-state imaging device and an angle of incident light. Specifically, in a pixel lying near the center of the solid-state imaging device, a percentage of light incident from immediately above (light denoted as α in FIG. 9) is higher than a percentage of light having another incident angle. On the other hand, in a pixel lying in a right area of the solid-state imaging device, a percentage of oblique light incident from the left (light denoted as β in FIG. 9) is higher than a percentage of light having another incident angle. Also, in a pixel lying in a left area of the solid-state imaging device, a percentage of oblique light incident from the right (light denoted as γ in FIG. 9) is higher than a percentage of light having another incident angle.

The light incident from immediately above onto the solid-state imaging device is collected by the on-chip micro lens 514 and the intralayer lens 510, and enters the photodiode 504 with a high degree of efficiency. On the other hand, even if the oblique light is reflected by the reflecting wall 512, a portion of the oblique light is prevented from entering the photodiode 504 by the light-shielding film 508, for example. That is, the probability that the oblique light enters the photodiode 504 is lower than the probability that the light incident from immediately above enters the photodiode 504. As a result, the pixel in the right and left area with a higher percentage of oblique light has lower light sensitivity than the pixel in the central area with a lower percentage of oblique light. Specifically, as shown in FIG. 10, pixels located at the right and left edges of the solid-state imaging device have lower light sensitivity, and a pixel located at the center of the solid-state imaging device has higher light sensitivity.

SUMMARY OF THE INVENTION

Therefore, an object of the present invention is to provide a solid-state imaging device capable of preventing color mixing caused by oblique light, and reducing variation in light sensitivity among pixels.

The present invention has the following features to attain the object mentioned above.

The present invention is directed to a solid-state imaging device comprising: a semiconductor substrate; a plurality of light-sensitive elements arranged in a matrix form at regular spacings in a photoreceiving region provided on the semiconductor substrate; a plurality of detecting electrodes provided on the semiconductor substrate corresponding to the plurality of the light-sensitive elements for detecting an electrical charge generated by each light-sensitive element; a light-shielding film coating the plurality of detecting electrodes and having an aperture over each light-sensitive element; and a plurality of reflecting walls, which are formed in a grid pattern over the light-shielding film so as to partition the apertures individually over the respective light-sensitive elements, for reflecting a portion of light entering the semiconductor substrate from above onto the aperture on each light-sensitive element. The plurality of reflecting walls are formed so that a middle point of the reflecting walls opposing each other across the aperture is displaced from the center of the aperture toward the center of the photoreceiving region, and the amount of displacement between the middle point of the reflecting walls opposing each other across the aperture and the center of the aperture depends on a distance from the center of the photoreceiving region to the center of the aperture.

Preferably, the greater a distance from the center of the photoreceiving region becomes, the greater the amount of displacement between the middle point of the reflecting walls opposing each other across the aperture and the center of the aperture.

Preferably, a vertical cross section of the reflecting wall is a trapezoid whose upper base is longer than a lower base.

A plurality of intralayer lenses, each of which is placed over the corresponding aperture in an area surrounded by the plurality of reflecting walls, for collecting light onto the aperture may be further included. Preferably, the center of each of the plurality of intralayer lenses is displaced from the center of the aperture toward the center of the photoreceiving region by an amount depending on the distance from the center of the photoreceiving region to the center of the aperture.

Also, a color filter formed on the plurality of reflecting walls, and a plurality of micro lenses formed on the color filter so as to correspond to the respective light-sensitive elements may be further included. Preferably, the center of each of the plurality of micro lenses is displaced from the center of the aperture toward the center of the photoreceiving region by an amount depending on the distance from the center of the photoreceiving region to the center of the aperture.

Note that the present invention is also directed to a manufacturing method of the solid-state imaging device.

In the solid-state imaging device according to the present invention, the reflecting wall is formed so as to be displaced toward the center of the photoreceiving region, whereby it is possible to reduce a difference in the light sensitivity between the central area of the photoreceiving region and its peripheral area.

Also, in the solid-state imaging device according to the present invention, the greater a distance from the center of the photoreceiving region becomes, the greater the amount of displacement of the reflecting wall becomes. Here, a pixel receives more oblique light as it becomes closer to the edge of the photoreceiving region. Thus, it is possible to effectively reduce a difference in the light sensitivity between the central area of the photoreceiving region and its peripheral area by increasing the amount of displacement of the reflecting wall by an amount depending on the distance from the center of the photoreceiving region to the reflecting wall.

Also, a cross section of the reflecting wall is a trapezoid whose upper base is longer than the lower base, whereby it is possible to cause the oblique light to be reflected toward the aperture more efficiently. As a result, it is possible to efficiently collect the light onto the light-sensitive element.

Also, the intralayer lens allows the light to be efficiently collected onto the light-sensitive element. Further, the center of the intralayer lens is displaced from the center of the aperture toward the center of the photoreceiving region, whereby it is possible to efficiently collect the oblique light onto the light-sensitive element.

Also, the on-chip micro lens allows the light to be efficiently collected onto the light-sensitive element. Further, the center of the on-chip micro lens is displaced from the center of the aperture toward the center of the photoreceiving region, whereby it is possible to efficiently collect the oblique light onto the light-sensitive element.

The present invention is directed not only to the solid-state imaging device but also to the manufacturing method of the solid-state imaging device. Based on the manufacturing method of the solid-state imaging device, it is possible to manufacture the solid-state imaging device of the present invention.

These and other objects, features, aspects and advantages of the present invention will become more apparent from the following detailed description of the present invention when taken in conjunction with the accompanying drawings.

DESCRIPTION OF THE PREFERRED
EMBODIMENTS

Figure 1:
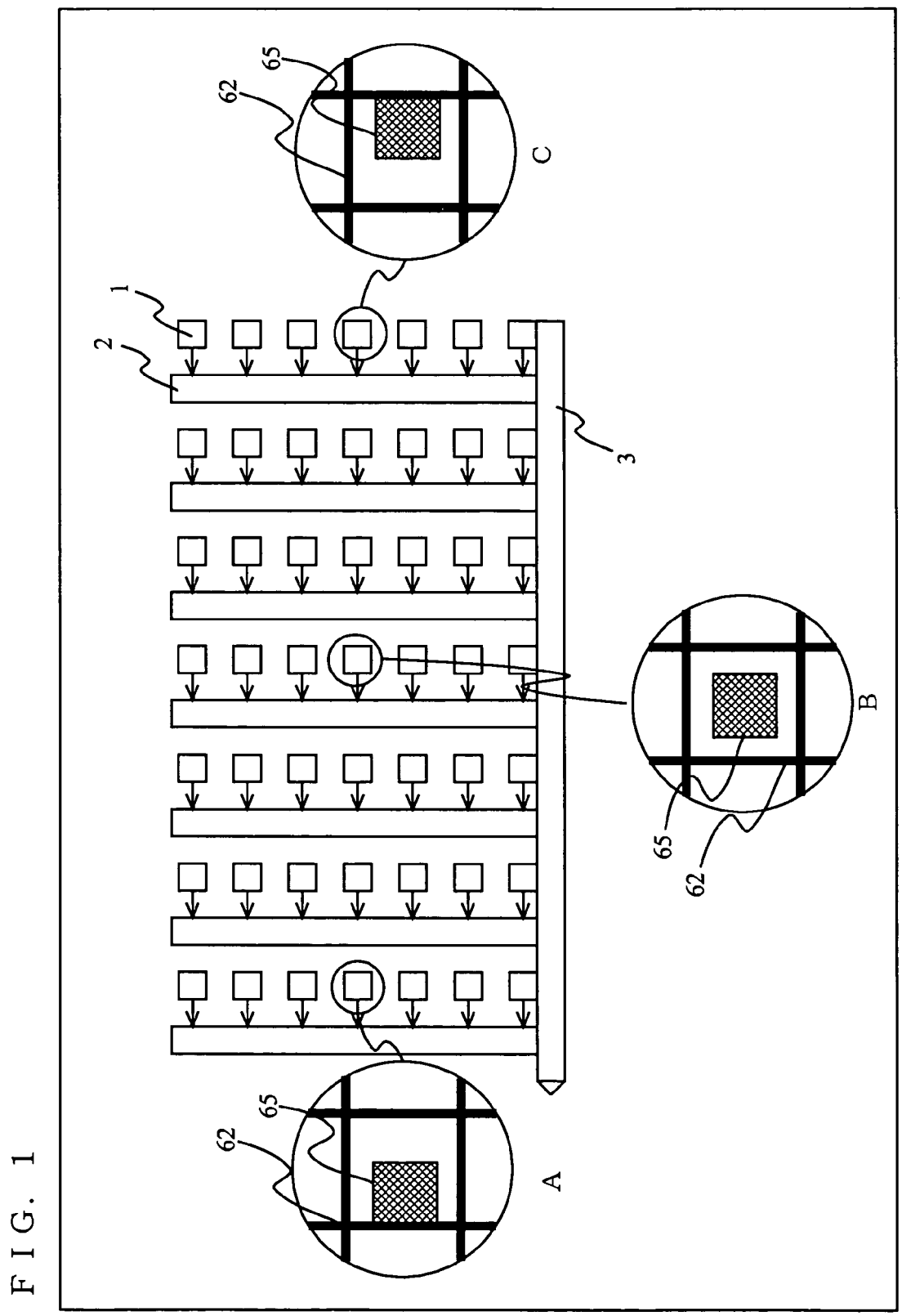
FIG. 1 is an illustration showing a structure of the entirety of a solid-state imaging device of the present invention.
Figure 2A:
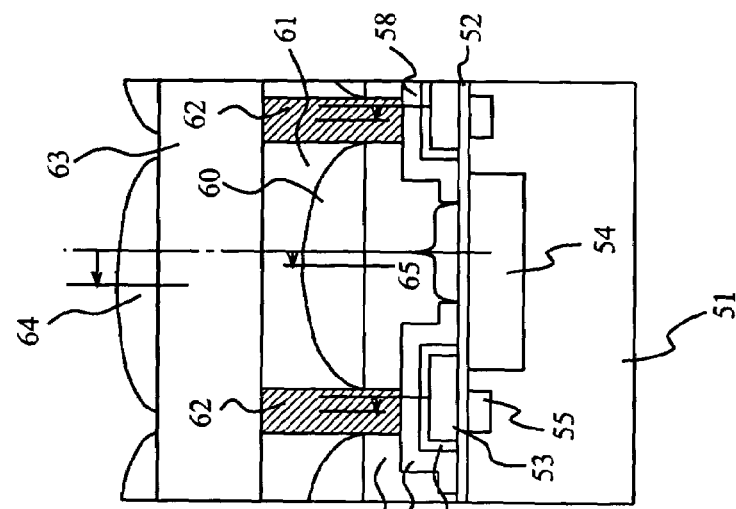
FIGS. 2A to 2C are cross section views of the solid-state imaging device of the present invention.
Figure 2B:
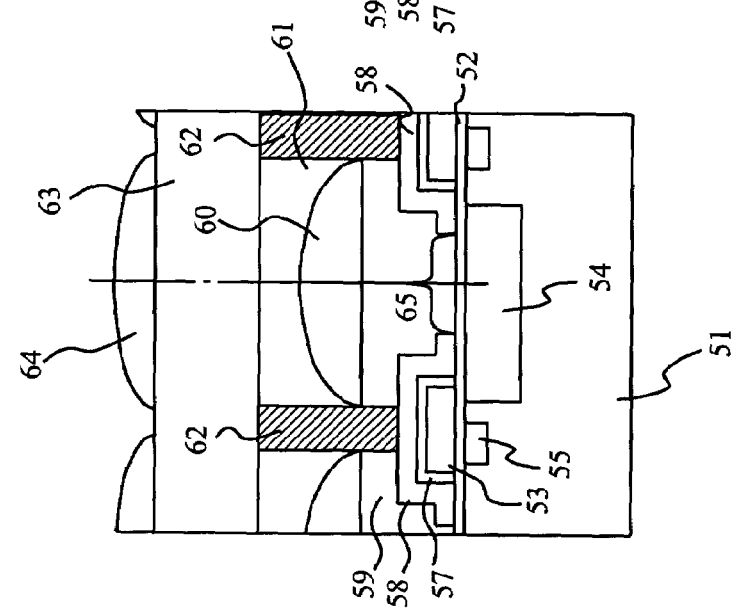
Figure 2C:
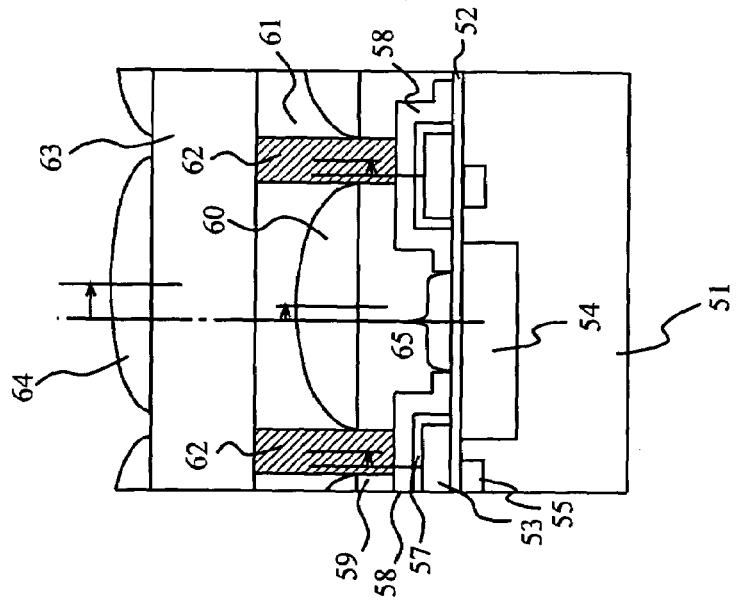

Hereinafter, with reference to the drawings, a solid-state imaging device according to one embodiment of the present invention will be described. FIG. 1 is an illustration showing a structure of the entirety of the solid-state imaging device according to the present embodiment. FIGS. 2A to 2C are cross section views of pixels located at the left edge, at the center, and at the right edge, respectively, of a photoreceiving region of the solid-state imaging device as shown in FIG. 1.

As shown in FIG. 1, the solid-state imaging device according to the present embodiment includes a light receiving section 1, a vertical CCD shift resistor 2, and a horizontal CCD shift resistor 3.

The light receiving section 1 includes a light-sensitive element such as a photodiode, and a plurality of the light receiving sections 1 are arranged in a matrix form at regular spacings in a rectangular photoreceiving region, as shown in FIG. 1. The light receiving section 1 generates a signal charge whose electrical charge is proportional to the intensity of light incident from outside. The vertical CCD shift resistor 2 is longitudinally placed between lines, each of which is composed of a plurality of light-sensitive elements 1. The vertical CCD shift resistor 2 transfers a signal charge generated by each light receiving section 1 in a vertical direction of FIG. 1. The horizontal CCD shift resistor 3 transfers a signal charge transferred from the vertical CCD shift resistor 2 in a horizontal direction of FIG. 1, thereby transferring the signal charge to the outside of the solid-state imaging device. Note that encircled illustrations A to C in FIG. 1 are enlarged views of pixels located at the right edge of the photoreceiving region, at the center thereof, and at the left edge thereof, respectively.

Next, cross section views of the respective enlarged views A to C of FIG. 1 will be described using FIG. 2. FIG. 2A is a cross section view of the enlarged view A of FIG. 1. FIG. 2B is a cross section view of the enlarged view B of FIG. 1. FIG. 2C is a cross section view of the enlarged view C of FIG. 1. As shown in FIG. 2, a pixel of the solid-state imaging device according to the present embodiment includes a semiconductor substrate 51, a gate insulating film 52, a gate electrode 53, a photodiode 54, a charge transfer section 55, an interlayer insulating film 57, a light-shielding film 58, an insulating film 59, an intralayer lens 60, a planarization film 61, a reflecting wall 62, a color filter 63, and an on-chip micro lens 64.

A plurality of photodiodes 54 are formed in a matrix form at regular spacings on the semiconductor substrate 51. Note that the photodiode 54 generates a signal charge whose electrical charge is proportional to the intensity of light incident from above (i.e., an upper portion of FIG. 2). Further, the charge transfer section 55 is formed on the left side of the photodiode 54 so as to be away therefrom. The charge transfer section 55 is included in the horizontal CCD shift resistor 3 as shown in FIG. 1.

The gate insulating film 52, which is a silicon oxide film, is formed on the semiconductor substrate 51. Also, on the gate insulating film 52, the polysilicon gate electrode 53 is formed immediately above the charge transfer section 55. The gate electrode 53 detects a signal charge generated by the photodiode 54, and outputs the detected signal charge to the charge transfer section 55. Also, the interlayer insulating film 57, which is a silicon oxide film, is formed so as to coat the gate electrode 53. Further, the light-shielding film 58 is formed so as to coat the interlayer insulating film 57. The light-shielding film 58, which prevents light from entering the gate electrode 53, is made of W (tungsten), for example. Note that an aperture 65 is formed in a portion of the light-shielding film 58, thereby allowing light to pass through the aperture 65 to the photodiode 54. The apertures 65 are formed immediately above the respective photodiodes 54 in a matrix form at regular spacings.

The insulating film 59 is formed on the light-shielding film 58 and the aperture 65. The insulating film 59 is optically transparent, and is formed as a BPSG film, for example, which is deposited by a CVD method. In an area over the aperture 65, the intralayer lens 60 is formed on the insulating film 59 for collecting light incident from above onto the photodiode 54. Further, the planarization film 61, which is a silicon oxide film, is formed on the intralayer lens 60 and the insulating film 59. The planarization film 61 is optically transparent, and has a refractive index lower than that of the intralayer lens 60.

Also, the metal (e.g., W and Ti (titanium)) reflecting wall 62 is formed inside the planarization film 61 and the insulating film 59 so as to create a grid pattern when the semiconductor substrate 51 is viewed from above. The reflection wall 62 reflects a portion of light (specifically, oblique light) incident from above onto the aperture 65. Here, with reference to FIGS. 1 and 2, the placement of the reflecting wall 62, which is one of the features of the present invention, will be described in detail.

The reflecting wall 62 of the solid-state imaging device according to the preset embodiment is formed so that a middle point between the reflecting walls opposing each other across the aperture 65 is displaced from the center of the aperture 65 toward the center of the photoreceiving region. Specifically, in the pixel located at the right edge of the photoreceiving region, the reflecting wall 62 is displaced in a right direction, as shown in the encircled illustration A of FIG. 1 and FIG. 2A. Also, in the pixel located at the left edge of the photoreceiving region, the reflecting wall 62 is displaced in a left direction, as shown in the encircled illustration C of FIG. 1 and FIG. 2C. Note that, in the pixel located in the center of the photoreceiving region, a middle point between the reflecting walls 62 opposing each other across the aperture 65 coincides with the center of the aperture 65, as shown in the encircled illustration B of FIG. 1 and FIG. 2B. Also, in the pixel located at the upper edge of the photoreceiving region, the reflecting wall 62 is displaced in a lower direction. On the other hand, in the pixel located at the lower edge of the photoreceiving region, reflecting wall 62 is displaced in an upper direction.

Figure 3:
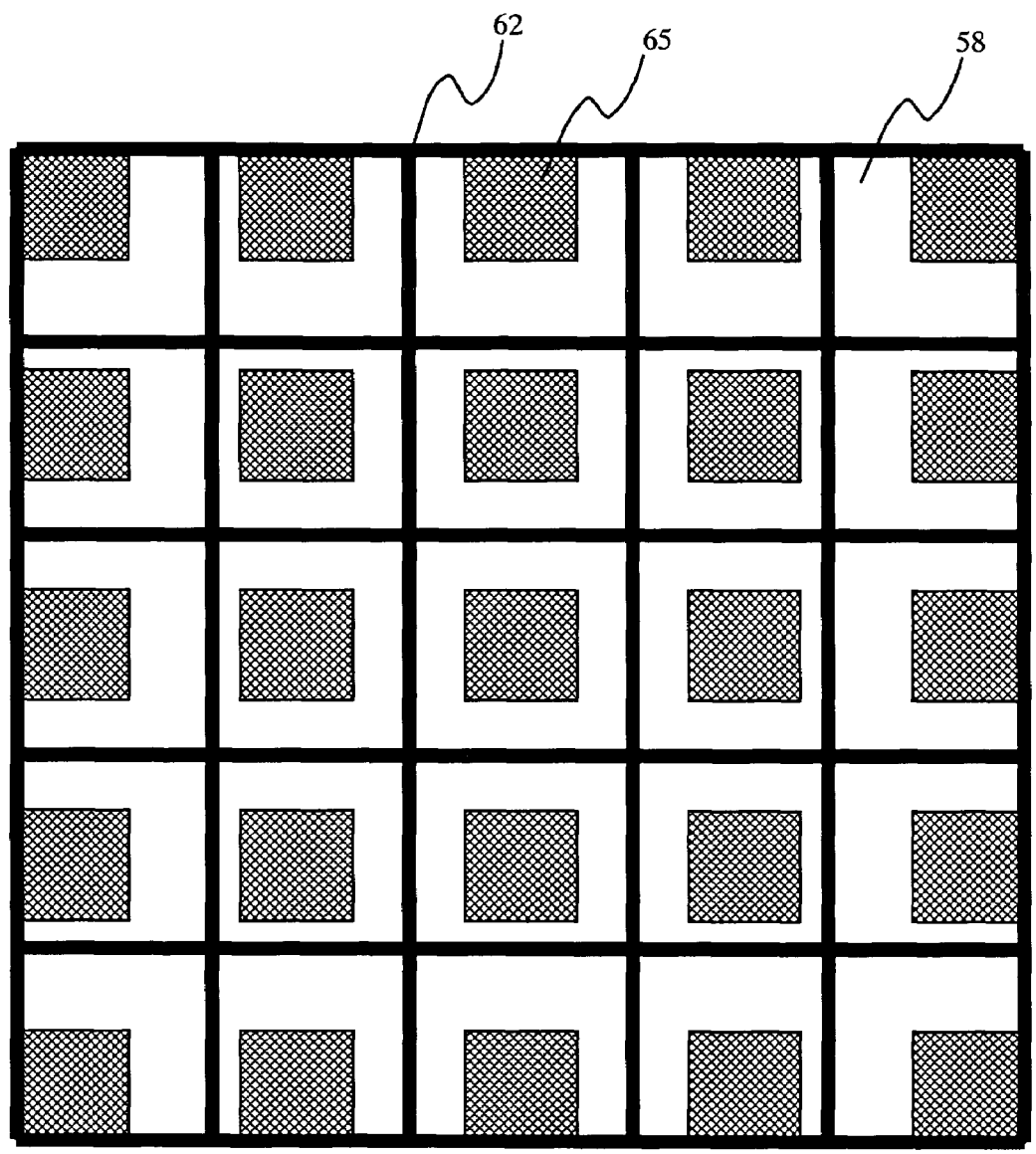
FIG. 3 is an illustration showing a positional relationship between an aperture and a reflecting wall of the solid-state imaging device of the present invention.

Here, the amount of displacement of the reflecting wall 62 will be described using FIG. 3. FIG. 3 is an illustration showing a positional relationship between the aperture 65 and the reflecting wall 62. Note that, for the sake of simplification, assume that the photoreceiving region has a 5×5 matrix arrangement.

Figure 4A:
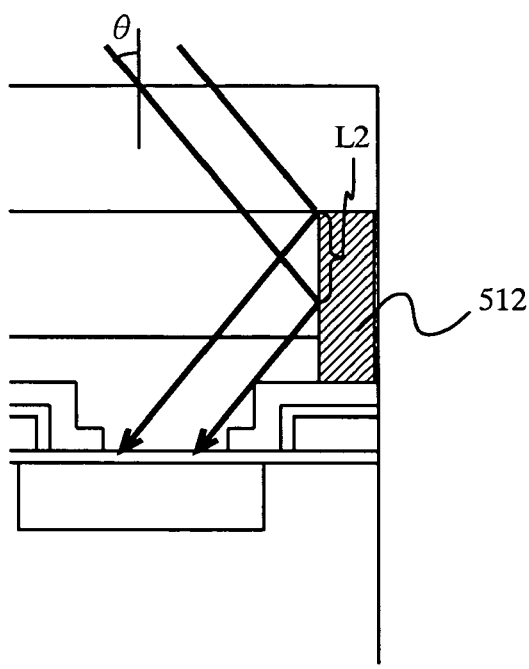
FIGS. 4A and 4B are illustrations for describing an effect of the solid-state imaging device of the present invention.
Figure 4B:
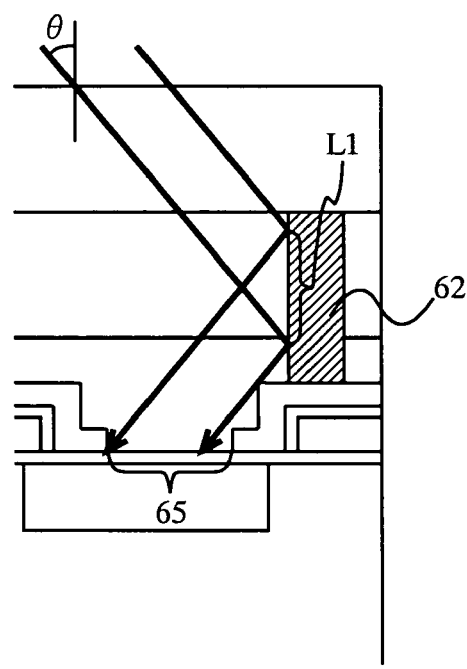

As shown in FIG. 3, the openings 65 are formed in a matrix format regular spacings on the light-shielding film 58. Further, the reflecting walls 62 are formed over the light-shielding film 58 in a grid pattern. Also, the greater the distance from the center of the photoreceiving region becomes, the greater the amount of displacement between a middle point of the reflecting walls 62 opposing each other across the aperture 65 and the center of the aperture 65 becomes. As such, the further the aperture 65 is away from the center of the photoreceiving region, the further the reflecting wall 62 is displaced toward the center of the photoreceiving region relative to the aperture 65, whereby it is possible to efficiently collect incident light onto the photodiode 54 in a position away from the center of the photoreceiving region, which will be described below in detail with reference to the drawings. FIG. 4A is a cross section view of a pixel located at the right edge of the photoreceiving region of a conventional solid-state imaging device. FIG. 4B is a cross section view of a pixel located at the right edge of the photoreceiving region of the solid-state imaging device of the present embodiment. Note that, for the sake of simplification, the intralayer lens 60, etc., is omitted.

First, as described in the BACKGROUND OF THE INVENTION section, in a pixel located at the right edge of the photoreceiving region, a percentage of oblique light incident from the left is higher than a percentage of light having another incident angle. Thus, as shown in FIG. 4A, in the conventional solid-state imaging device, the oblique light entering the solid-state imaging device is reflected off the reflecting wall 512 and into the aperture.

However, as shown in FIG. 4A, the reflecting wall 512 is limited in height, whereby it is impossible to reflect the oblique light into the entire area of the aperture. Specifically, as shown in FIG. 4A, only the light reflected off a portion L2 of the reflecting wall 512 enters the aperture.

On the other hand, in the solid-state imaging device according to the present embodiment, the reflecting wall 62 of a pixel located at the right edge is displaced towards the left. Thus, as shown in FIG. 4B, it is possible to reflect the oblique light having the same incident angle as the light shown in FIG. 4A by using a lower portion of the reflecting wall 62 compared to the conventional solid-state imaging device. Thus, the oblique light reflected off a portion L1 of the reflecting wall 62 enters the aperture. A comparison between FIG. 4A and FIG. 4B shows that L1>L2, whereby the amount of light entering the aperture 65 is increased compared to the conventional solid-state imaging device. As a result, it is possible to improve the light sensitivity of the solid-state imaging device in an area other than the central area of the photoreceiving region, and it is possible to reduce a difference in the light sensitivity between the central area of the photoreceiving region of the solid-state imaging device and its peripheral area. Also, in the solid-state imaging device according to the present embodiment, it is possible to reflect the oblique light using the vicinity of the center of the reflecting wall 62, thereby efficiently collecting the oblique light having various incident angles onto the aperture.

With reference to the drawings, a manufacturing method of the above-described solid-state imaging device will be described below. FIGS. 5A to 5I are cross section views of the solid-state imaging device at each step of a manufacturing process.

Figure 5A:
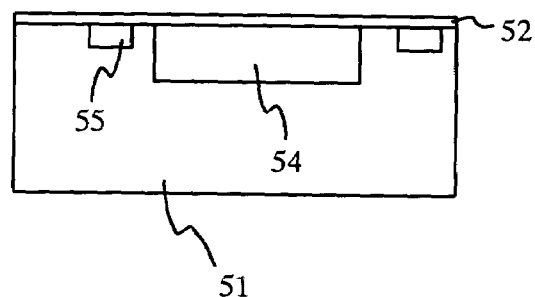
FIGS. 5A to 5I are cross section views of the solid-state imaging device of the present invention at each step of a manufacturing process.

First, the photodiode 54 is formed on the semiconductor substrate 51 so that a plurality of the photodiodes 54 are arranged in a matrix format regular spacings. Further, the charge transfer section 55 is formed next to the above-described photodiode 54 so as to be away therefrom. Then, the gate insulating film 52, which is a silicon oxide film, is formed on the semiconductor substrate 51 by a CVD method. As a result, the solid-state imaging device has a structure whose cross section is as shown in FIG. 5A.

Next, on the gate insulating film 52, the polysilicon gate electrode 53 is formed in an area immediately above the charge transfer section 55. Specifically, after a polysilicon film is deposited by a CVD method, the polysilicon film in a predetermined area is selectively removed by dry etching, whereby the gate electrode 53 is formed. After the gate electrode 53 is formed, the interlayer insulating film 57, which is a silicon oxide film, is formed so as to coat the gate electrode 53. Note that the interlayer insulating film 57 is formed by depositing a silicon oxide film by a CVD method and selectively removing the deposited silicon oxide film.

Figure 5B:
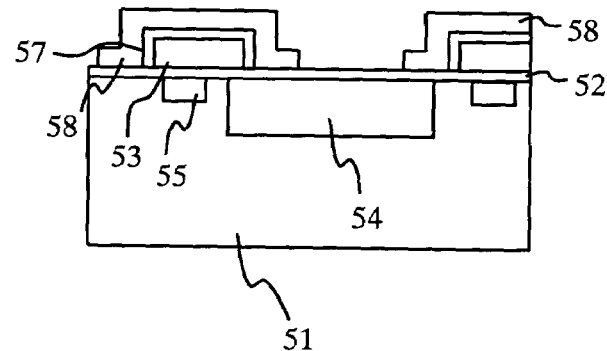

After the interlayer insulating film 57 is formed, the light-shielding film 58 is formed so as to coat the interlayer insulating film 57. Specifically, a W thin film is formed by a PVD method or a CVD method so as to coat the interlayer insulating film 57 and the gate insulating film 52. Then, the W thin film coating the photodiode 54 is selectively removed by dry etching, thereby forming the light-shielding film 58 and the aperture 65. As a result, the solid-state imaging device has a structure whose cross section is as shown in FIG. 5B.

Figure 5C:
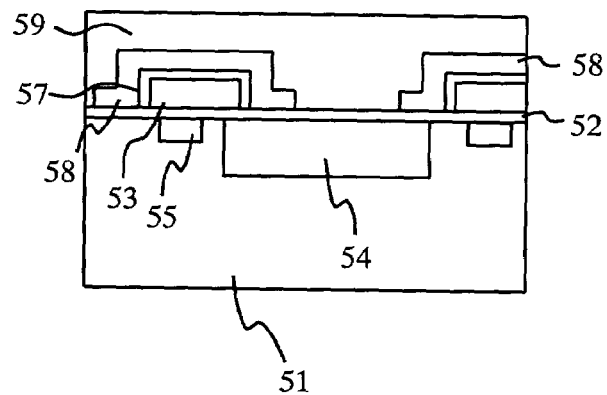

Next, a BPSG film is deposited on the light-shielding film 58 and the aperture 65 by a CVD method. Then, the BPSG film is reflowed by heating, whereby its surface is planarized. As a result, the insulating film 59 is formed, and the solid-state imaging device has a structure whose cross section is as shown in FIG. 5C.

After formation of the insulating film 59, the silicon nitride intralayer lens 60 is formed on the insulating film 59 over the aperture 65. The intralayer lens 60 is preferably formed in a position displaced from the center of the aperture 65 toward the center of the photoreceiving region.

Figure 5D:
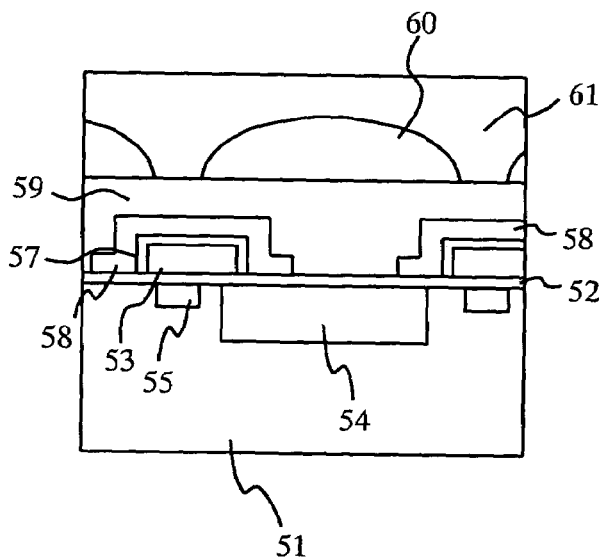

Further, a silicon oxide film is deposited on the intralayer lens 60 by a CVD method. Then, a surface of the silicon oxide film is planarized by a CMP method, thereby forming the planarization film 61. As a result, the solid-state imaging device has a structure whose cross section is as shown in FIG. 5D.

Next, a resist film with a grid pattern is formed on the planarization 61 film such that a trench, which will be described below, is formed between the apertures 65. Here, the resist film with a grid pattern is formed so that a middle point of the grid openings opposing each other across the aperture 65, which is formed on the light-shielding film 58, is displaced from the center of the aperture 65 toward the center of the photoreceiving region. Note that, the greater a distance from the center of the photoreceiving region becomes, the greater the amount of displacement between a middle point of the openings opposing each other across the aperture 65 of the light-shielding film 58 and the center of the aperture 65 becomes.

Figure 5E:
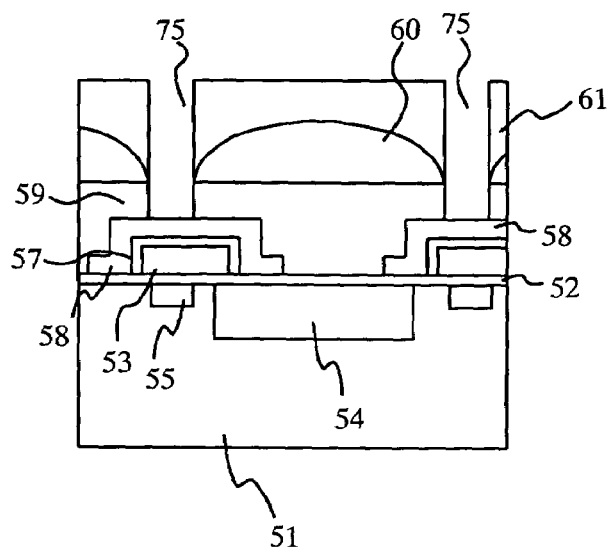

Next, dry etching using CxFy gas is performed, thereby selectively removing the planarization film 61 and the insulating film 59 lying under the grid opening of the mask. As a result, as shown in FIG. 5E, a trench 75 is formed. Note that the trench 75 is formed so that its width is no more than 1 μm.

Figure 5F:
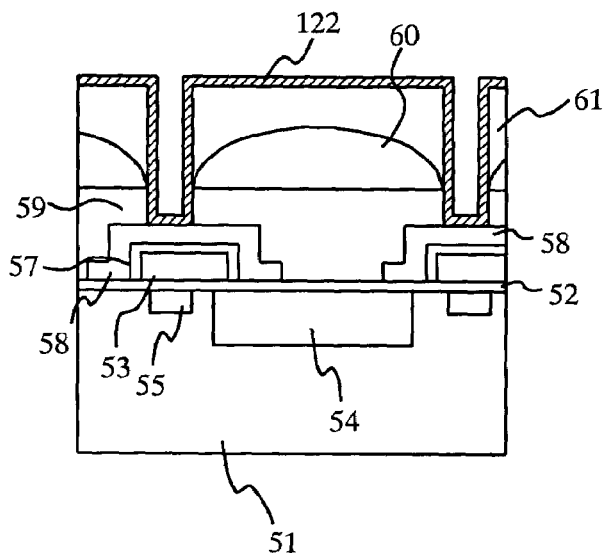
Figure 5G:
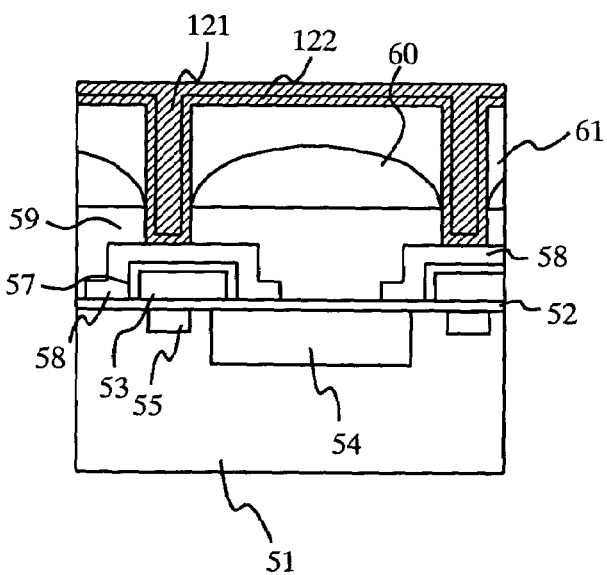
Figure 5H:
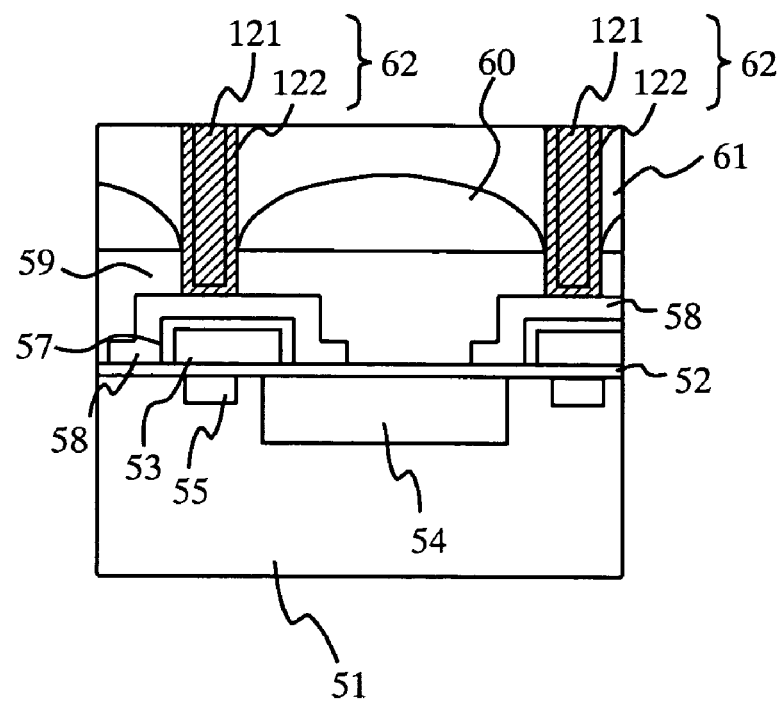

After formation of the trench 75, a Ti film 122 is formed by a PVD method, as shown in FIG. 5F. Then, as shown in FIG. 5G, a W film 121 is formed on the Ti film 122 by a CVD method. After deposition of the Ti film 122 and the W film 121 is completed, the excess Ti film 122 and the excess W film 121 lying off the trench 75 are removed by a CMP method or an etch back process. As a result, as shown in FIG. 5H, the reflecting wall 62 is formed.

Figure 5I:
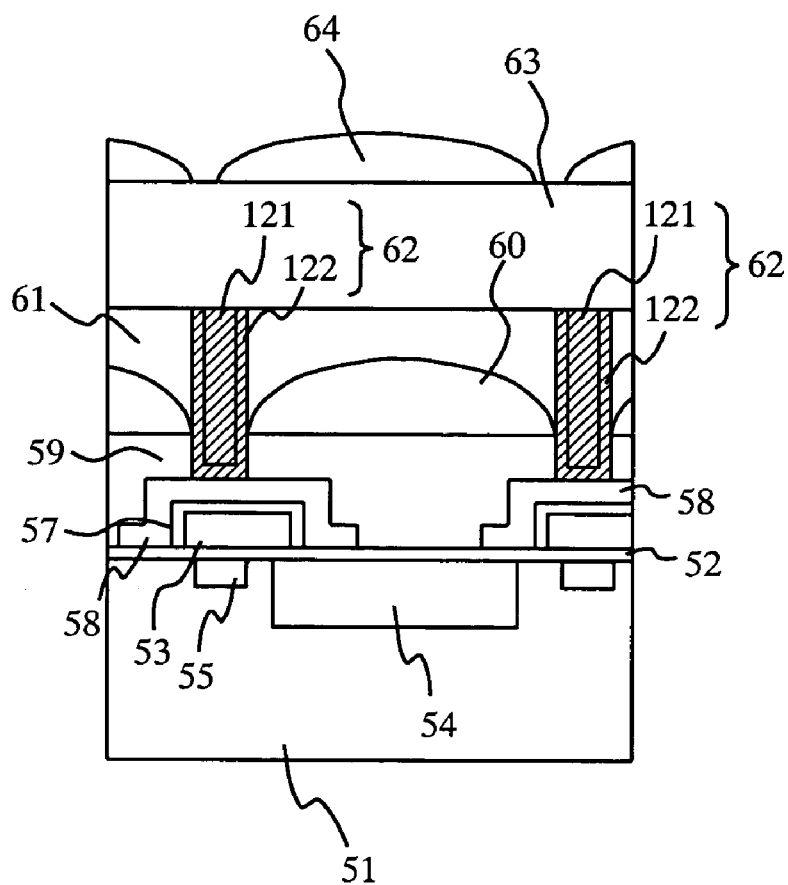

After formation of the reflecting wall 62 is completed, the color filter 63 is formed on the reflecting wall 62 and the planarization film 61. Specifically, a three-or four-layer film is deposited according to color coding by a dyeing method or color resist coating. Finally, the on-chip micro lens 64 is formed on the color filter 63. Specifically, the color filter 63 is coated with a hot-melt transparent resin, and a thermal reflow process is performed for a resist on the hot-melt transparent resin to form the on-chip micro lens 64. As a result, the solid-state imaging device having the structure as shown in FIG. 5I is completed. Note that the on-chip micro lens 64 is preferably formed in a position displaced from the center of the aperture 65 toward the center of the photoreceiving region.

As such, based on the solid-state imaging device according to the present embodiment, it is possible to reduce variations in light sensitivity caused between a central area of a photoreceiving region and its peripheral area. In the solid-state imaging device according to the present embodiment, it is possible to reflect the oblique light using the vicinity of the center of the reflecting wall, whereby it is possible to efficiently collect the oblique light having various incident angles onto the aperture.

Note that, in the solid-state imaging device according to the present embodiment, it is assumed that the further the aperture 65 is away from the center of the photoreceiving region, the further the reflecting wall 62 is displaced toward the center of the photoreceiving region relative to the aperture 65, but it is not limited thereto. For example, in the solid-state imaging device according to the present invention, in the case where the reflecting wall lies within a predetermined distance from the center of the photoreceiving region, the amount of displacement may be zero. In the case where the reflecting wall is positioned away by more than a predetermined distance from the center of the photoreceiving region, the amount of displacement may depend on the distance from the center of the photoreceiving region to the reflecting wall.

Also, the solid-state imaging device according to the present embodiment has been described based on the assumption that it is a CCD solid-state imaging device. However, the above-described solid-state imaging device may be a MOS solid-state imaging device.

Figure 6:
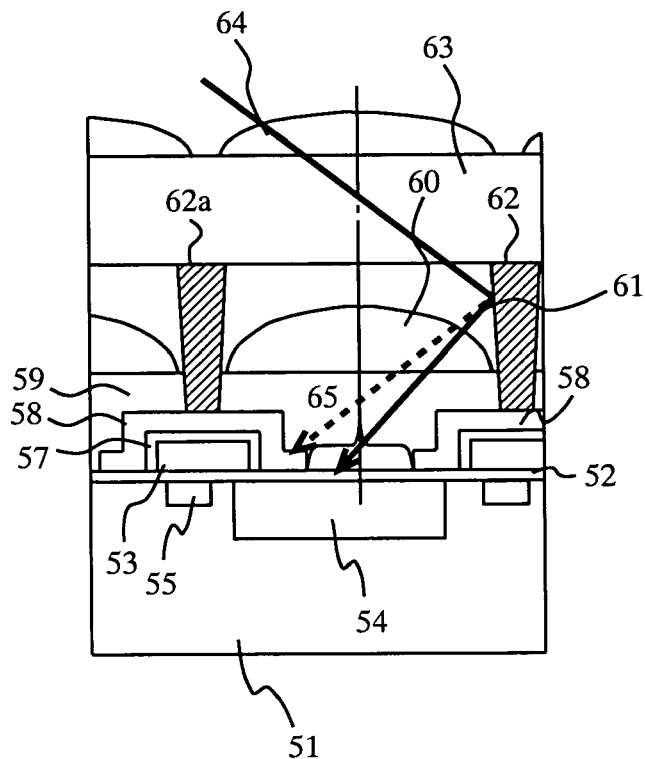
FIG. 6 is an illustration showing another structure of the solid-state imaging device of the present invention.

Also, a cross section of the reflecting wall of the solid-state imaging device according to the present embodiment is rectangular as shown in FIG. 2, but it is not limited thereto. For example, as shown in FIG. 6, a cross section of the reflecting wall may be a trapezoid whose upper base is longer than the lower base. As a result, as shown in FIG. 6, it is possible to further efficiently collect the oblique light onto the aperture. Further, the bottom of the reflecting wall is narrower than the bottom of the reflecting wall shown in FIG. 2, whereby it is possible to substantially move the reflecting wall from side to side. As a result, design freedom of the solid-state imaging device is increased.

Note that, in the present embodiment, it is assumed that the material of the reflecting wall is metal, but the material thereof is not limited thereto. For example, the material of the reflecting wall may have a refractive index lower than the material of the film around the reflecting wall. As a result, total internal reflection occurs at the reflecting wall, whereby it is possible to obtain the same effect as in the case in which metal is used as a reflecting wall.

Also, in the present embodiment, it is assumed that the gate electrode has a single layer structure, but it is not limited thereto. For example, the gate electrode may be a multi-layer of polysilicon, a silicon oxide film, and polysilicon, which are deposited on the gate insulating film.

Also, in the present embodiment, the planarization film, which is formed on the intralayer lens, may be formed as a result of the following process: a resin such as SOG is applied, a thin film is deposited as a TEOS $SiO_2$/BPSG film or as a high density plasma $SiO_2$ CVD film, and planarization is performed by an etch back process or a CMP method. Also, the planarization film may be made of SiON in place of $SiO_2$.

Figure 7:
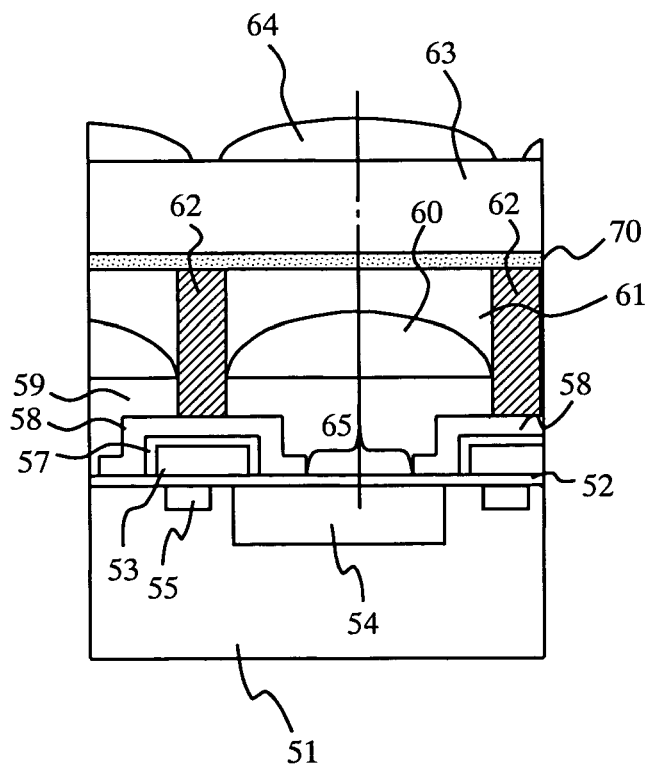
FIG. 7 is an illustration showing still another structure of the solid-state imaging device of the present invention.
Figure 8:
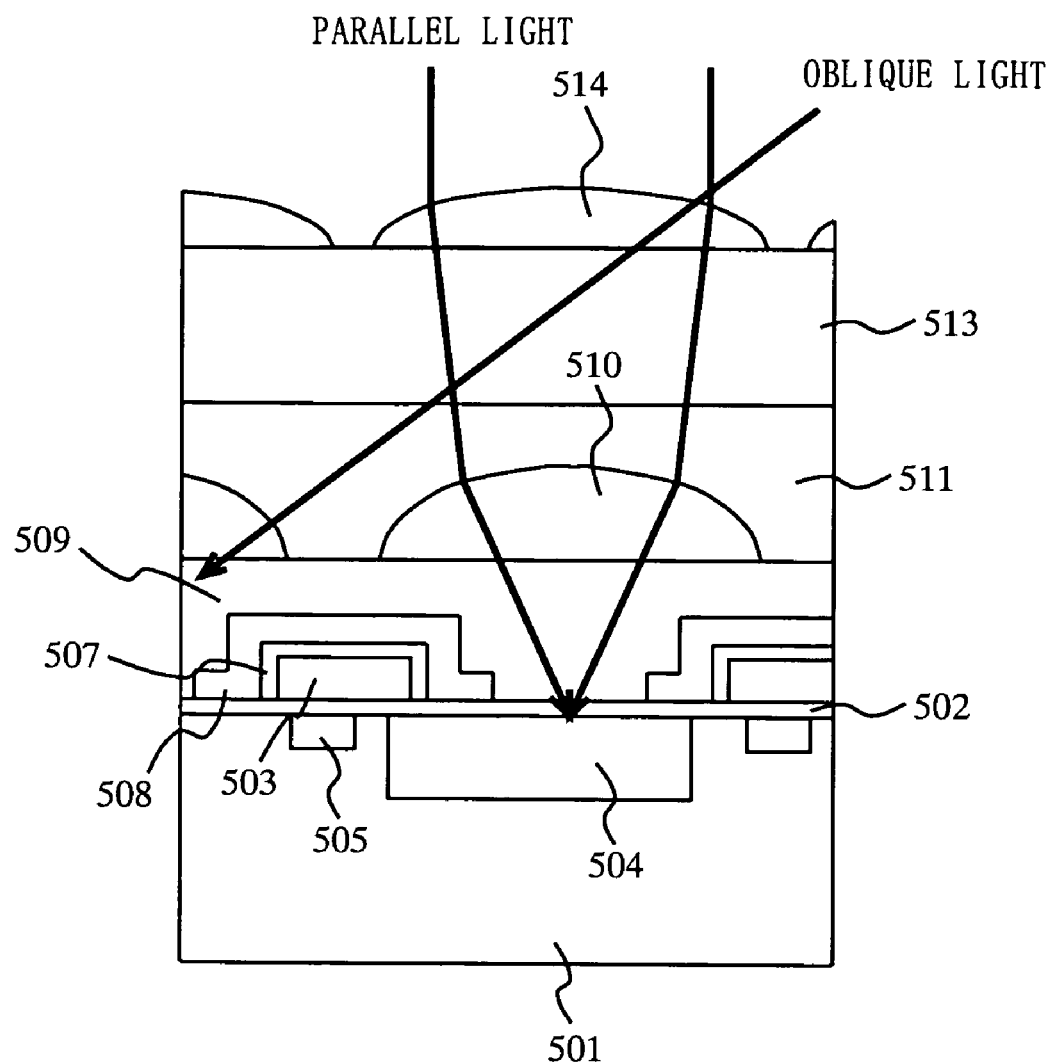
FIG. 8 is a cross section view of a conventional solid-state imaging device.
Figure 9:
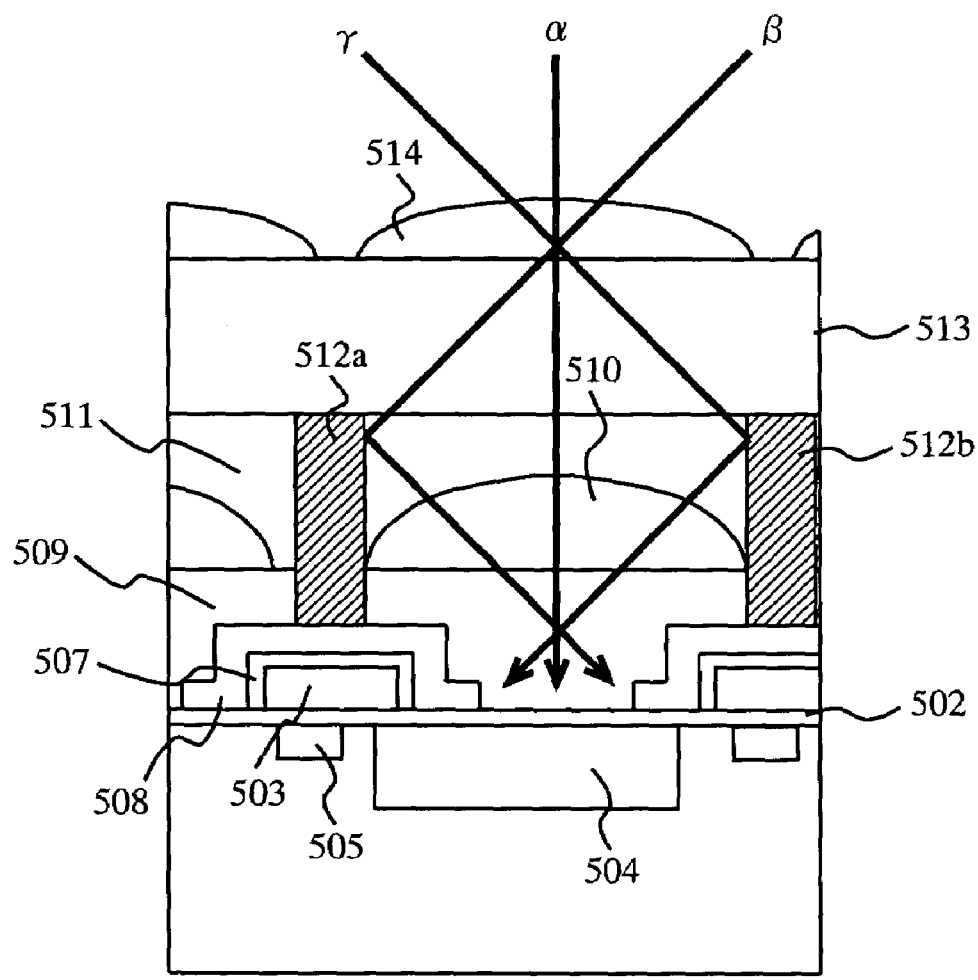
FIG. 9 is a cross section view of a conventional solid-state imaging device.
Figure 10:
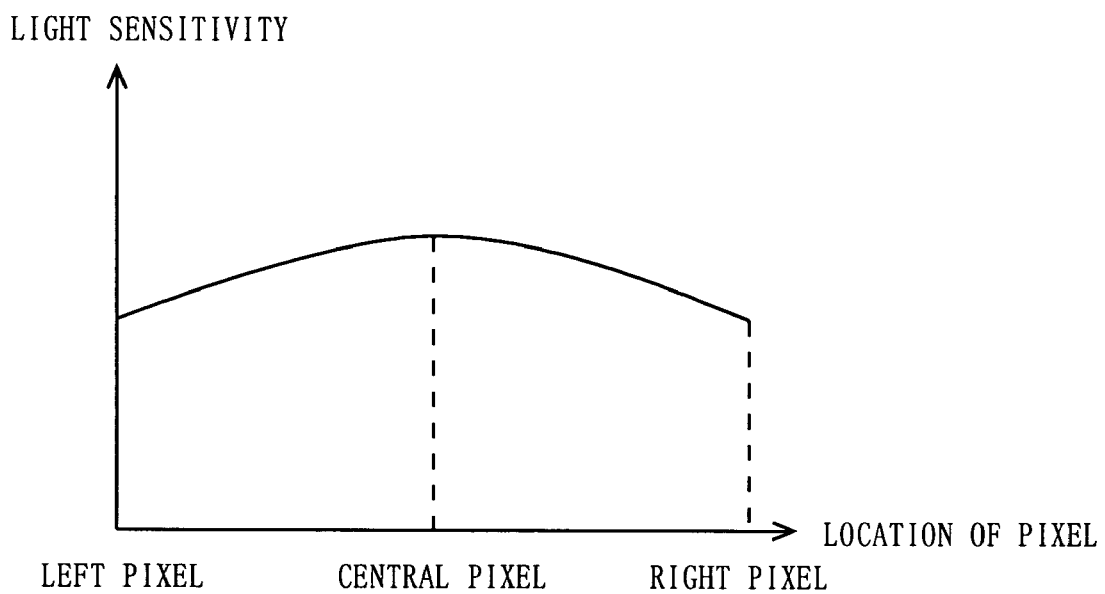
FIG. 10 is an illustration showing a distribution of light sensitivity of the conventional solid-state imaging device.

Also, in the solid-state imaging device according to the present embodiment, as shown in FIG. 7, an element planarization film 70 may be provided between the reflecting wall and the planarization film, and the color filter.

Also, in the solid-state imaging device according to the present embodiment, as shown in FIG. 2, the light-shielding film 58 is in contact with the reflecting wall 62. However, the light-shielding film 58 does not necessarily need to be in contact with the reflecting wall 62.

The solid-state imaging device according to the present invention is able to prevent color mixing caused by the oblique light. Also, the solid-state imaging device according to the present invention can be used, for example, as a solid-state imaging device including a plurality of light-sensitive elements arranged in a matrix form, such a device requiring a reduction in variation in the light sensitivity among the pixels.

While the invention has been described in detail, the foregoing description is in all aspects illustrative and not restrictive. It is understood that numerous other modifications and variations can be devised without departing from the scope of the invention.

What is claimed is:

1. A solid-state imaging device comprising:
a semiconductor substrate;
a photoreceiving region provided on the semiconductor substrate;
a plurality of light-sensitive elements provided in the photoreceiving region;
a plurality of apertures, which are provided over the light-sensitive elements, for delivering an incident light to the light-sensitive elements;
a plurality of reflecting walls formed over the light-sensitive elements and the apertures so as to oppose each other across the apertures; and
a plurality of micro lenses provided over the reflecting walls and the apertures,
wherein the plurality of micro lenses disposed in an inner periphery of the photoreceiving region, and the plurality of reflecting walls corresponding to the micro lenses are disposed such that a center of each of the micro lenses and a center of each of the reflecting walls opposing each other are displaced from a center of the aperture toward a center of the photoreceiving region, and
an amount of displacement between the center of the photoreceiving region and the center of the reflecting walls is smaller than that of displacement between the center of the photoreceiving region and the center of the micro lens.

2. The solid-state imaging device according to claim 1, wherein the greater a distance from the center of the photoreceiving region becomes,
the greater an amount of displacement between the center of the photoreceiving region and the center of the reflecting walls is, and
the greater an amount of displacement between the center of the photoreceiving region and the center of the micro lens is.

3. The solid-state imaging device according to claim 1, wherein a vertical cross section of the reflecting wall is a trapezoid whose upper base is longer than a lower base.

4. The solid-state imaging device according to claim 1, wherein a color filter is formed on each of the plurality of reflecting walls.

5. The solid-state imaging device according to claim 1, wherein the reflecting walls are composed of metal.

6. The solid-state imaging device according to claim 1, wherein the reflecting walls are composed of a material having a refractive index lower than that of an insulating film disposed between the reflecting walls.

7. The solid-state imaging device according to claim 6, wherein the insulating film is composed of any one selected from a group consisting of SOG resin layer, SiO2 and SiON.

8. The solid-state imaging device according to claim 1, wherein the solid-state imaging device is a CCD type solid-state imaging device.

9. The solid-state imaging device according to claim 1, wherein the solid-state imaging device is a MOS type solid-state imaging device.

10. A solid-state imaging device comprising:
a semiconductor substrate;
a photoreceiving region provided on the semiconductor substrate;
a plurality of light-sensitive elements provided in the photoreceiving region;
a plurality of apertures, which are provided over the light-sensitive elements, for delivering an incident light to the light-sensitive elements;

a plurality of reflecting walls provided over the light-sensitive elements and the apertures so as to oppose each other across the apertures;

a plurality of a first micro lenses provided between the reflecting walls; and a plurality of a second micro lenses provided over the reflecting walls and the apertures, wherein the plurality of the first and second micro lenses disposed in an inner periphery of the photoreceiving region, and the plurality of reflecting walls corresponding to the first and second micro lenses are disposed such that a center of each of the first micro lenses, a center of each of the second micro lenses, and a center of each of the reflecting walls opposing each other are displaced from a center of the aperture toward a center of the photoreceiving region, and an amount of displacement between the center of the photoreceiving region and the center of the reflecting walls, an amount of displacement between the center of the photoreceiving region and the center of the first micro lens are smaller than that of displacement between the center of the photoreceiving region and the center of the second micro lens.

11. The solid-state imaging device according to claim 10, wherein the greater a distance from the center of the photoreceiving region becomes, the greater an amount of displacement between the center of the photoreceiving region and the center of the reflecting walls is, the greater an amount of displacement between the center of the photoreceiving region and the center of the first micro lens is, and the greater an amount of displacement between the center of the photoreceiving region and the center of the second micro lens is.

12. The solid-state imaging device according to claim 10, wherein a vertical cross section of the reflecting wall is a trapezoid whose upper base is longer than a lower base.

13. The solid-state imaging device according to claim 10, wherein a color filter is formed on each of the plurality of reflecting walls.

14. The solid-state imaging device according to claim 10, wherein the reflecting walls are composed of metal.

15. The solid-state imaging device according to claim 10, wherein the reflecting walls are composed of a material having a refractive index lower than that of an insulating film disposed between the reflecting walls.

16. The solid-state imaging device according to claim 15, wherein the insulating film is composed of any one selected from a group consisting of SOG resin layer, SiO2 and SiON.

17. The solid-state imaging device according to claim 10, wherein the solid-state imaging device is a CCD type solid-state imaging device.

18. The solid-state imaging device according to claim 10, wherein the solid-state imaging device is a MOS type solid-state imaging device.

* * * * *